US009773665B1

(12) United States Patent
Zeng et al.

(10) Patent No.: US 9,773,665 B1
(45) Date of Patent: Sep. 26, 2017

(54) PARTICLE REDUCTION IN A PHYSICAL VAPOR DEPOSITION CHAMBER

(71) Applicant: APPLIED MATERIALS, INC., Santa Clara, CA (US)

(72) Inventors: Weimin Zeng, San Jose, CA (US); Thanh X. Nguyen, San Jose, CA (US); Yong Cao, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/371,142

(22) Filed: Dec. 6, 2016

(51) Int. Cl.
H01L 21/02 (2006.01)
C23C 14/22 (2006.01)
C23C 14/06 (2006.01)

(52) U.S. Cl.
CPC .... H01L 21/02532 (2013.01); C23C 14/0652 (2013.01); C23C 14/22 (2013.01); H01L 21/02592 (2013.01); H01L 21/02631 (2013.01)

(58) Field of Classification Search
None
See application file for complete search history.

(56) References Cited

U.S. PATENT DOCUMENTS

| 8,642,128 | B2 | 2/2014 | Choi et al. |
| 2006/0264060 | A1* | 11/2006 | Ramaswamy ......... C23C 16/26 438/758 |
| 2010/0055298 | A1 | 3/2010 | Sommers et al. |
| 2013/0199925 | A1* | 8/2013 | Cao ....................... C23C 14/345 204/192.15 |
| 2015/0075980 | A1* | 3/2015 | Nguyen ............. H01J 37/3441 204/298.09 |
| 2016/0168687 | A1 | 6/2016 | Ramalingam et al. |

* cited by examiner

*Primary Examiner* — Asok K Sarkar
(74) *Attorney, Agent, or Firm* — Moser Taboada; Alan Taboada

(57) ABSTRACT

Methods and apparatus for reducing particles generated in a process carried out in a process chamber are provided herein. In some embodiments, a process kit shield includes: a body having a surface facing a processing volume of a physical vapor deposition (PVD) process chamber, wherein the body is composed of aluminum oxide ($Al_2O_3$), and a silicon nitride layer on the surface of the body.

20 Claims, 4 Drawing Sheets

PARTICLE REDUCTION IN A PHYSICAL VAPOR DEPOSITION CHAMBER

FIELD

Embodiments of the present disclosure generally relate to substrate processing equipment, more particularly, to methods and apparatus for reducing the number of particles produced during processes carried out in a physical vapor deposition process chamber.

BACKGROUND

Amorphous silicon films can used in a variety of semiconductor manufacturing applications. For example, amorphous silicon is often used, as a sacrificial layer in a self-aligned double patterning (SADP) process or a self-aligned quadruple patterning process (SAQP). Amorphous silicon material is typically deposited on a semiconductor wafer disposed atop a substrate support located within a process chamber. A process such as physical vapor deposition (PVD) may be used to deposit the material. During deposition, however, the amorphous silicon is not only deposited on the semiconductor wafer but is also deposited on inner surfaces of the process chamber, such as on a shield, a deposition ring, a cover ring, and/or chamber walls of the process chamber. The deposited amorphous silicon material may form a high-stress film on the semiconductor wafer and on the inner surfaces of the process chamber.

In addition, when a process is carried out in the PVD process chamber, the inner surface of the process chamber typically goes through a thermal cycle, expanding as the inner surface heats up at the beginning of the cycle and contracting as the inner surface cools down at the end of the cycle. The thermal cycle is repeated in the process chamber each time that a process is carried out. The inventors have observed that the high stress on the film deposited on the inner surface of the process chamber, in combination with the repeated thermal cycling of the process chamber, undesirably causes the film to delaminate and generate particles. Typically, smaller particles are generated during thermal expansion, and larger particles are generated during thermal contraction, which is known as flaking.

The problem of flaking and particle generation could be addressed by performing preventive maintenance on the process chamber, such as by replacing the shield or other components within the process chamber. However, as device geometries have shrunk, and particle size and particle limit specifications have therefore tightened, the frequency of such preventive maintenance would also increase, undesirably resulting in increased downtime and higher cost of operating the process chamber.

Accordingly, the inventors have provided improved methods and apparatus for reducing the number of particles generated during a process carried out in a process chamber.

SUMMARY

Methods and apparatus for reducing particles generated in a process carried out in a process chamber are provided herein. In some embodiments, a process kit shield includes: a body having a surface facing a processing volume of a physical vapor deposition (PVD) process chamber, wherein the body is composed of aluminum oxide ($Al_2O_3$), and a silicon nitride layer on the surface of the body.

In some embodiments, a physical vapor deposition (PVD) process chamber for depositing an amorphous silicon material includes: a process kit shield comprising a body having a surface facing a processing volume of the physical vapor deposition (PVD) process chamber, wherein the body is composed of aluminum oxide ($Al_2O_3$), a silicon nitride layer having a first thickness on the surface of the body; and an amorphous silicon layer having a second thickness on the silicon nitride layer; a substrate support pedestal disposed in the process chamber beneath the processing volume; and a target disposed opposite the substrate support pedestal.

In some embodiments, a method of processing a substrate in a physical vapor deposition (PVD) process chamber includes: (a) depositing a silicon nitride layer atop a surface of a process kit shield facing a processing volume of the PVD process chamber, wherein the process kit shield comprises a body composed of aluminum oxide ($Al_2O_3$), and wherein the silicon nitride layer is deposited without a substrate disposed in the PVD process chamber; (b) subsequently depositing an amorphous silicon layer onto a predetermined number of substrates in the PVD process chamber, wherein amorphous silicon material also forms an amorphous silicon layer on the silicon nitride layer.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
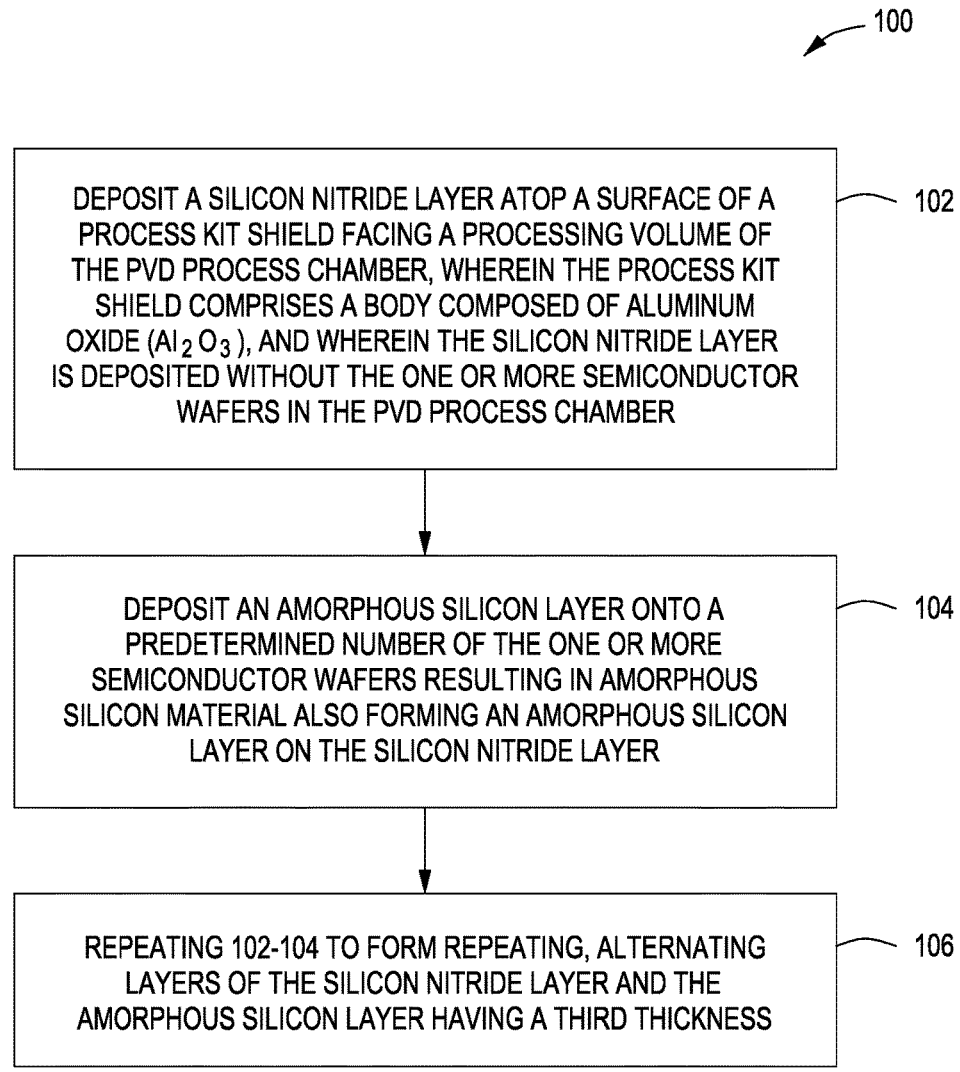
FIG. 1 is a flow diagram illustrating an example of a method of reducing the number of particles generated in a process chamber in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of the present disclosure advantageously reduce the number of particles generated in a physical vapor deposition process chamber during a process of depositing an amorphous silicon layer on one or more substrates, such as, for example, one or more semiconductor wafers.

Figure 2:
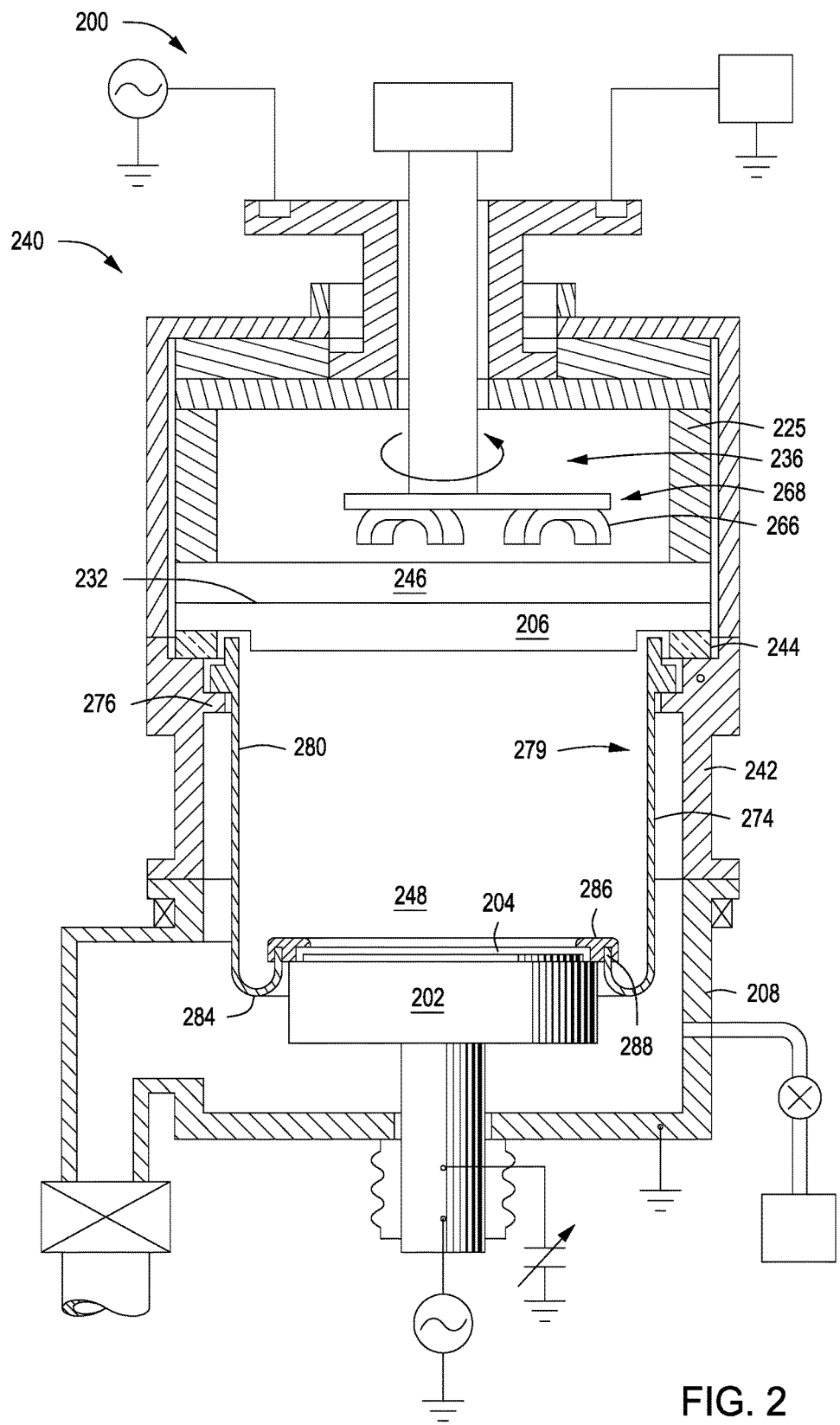
FIG. 2 is a schematic cross sectional view of a process chamber in accordance with some embodiments of the present disclosure.

FIG. 2 depicts a schematic, cross-sectional view of an illustrative physical vapor deposition (PVD) process chamber (process chamber 200) in accordance with some embodiments of the present disclosure. Examples of PVD chambers suitable for modification and use in accordance with the present disclosure include the ALPS® Plus, SIP ENCORE®, and other PVD processing chambers commercially available from Applied Materials, Inc., of Santa Clara, Calif. Other processing chambers from Applied Materials, Inc. or other manufactures may also benefit from the inventive apparatus disclosed herein.

The process chamber 200 contains a substrate support 202 for receiving a substrate 204 (e.g., a semiconductor wafer or other suitable substrate), a sputtering source, such as a target 206, and a process kit shield 274 disposed between the substrate support 202 and the target 206.

The process kit shield 274 comprises a body 279 having a surface 280 facing a processing volume 248 of the process chamber 200. The processing volume 248 may be defined as the volume located above the substrate support 202 during processing (for example, between the target 206 and the substrate support 202 when in a processing position). The body 279 is composed of aluminum oxide ($Al_2O_3$) (also known as aluminum (III) oxide).

The inventors have observed that the body 279 of the process kit shield 274 is typically made of aluminum (Al). The coefficient of thermal expansion (CTE) of aluminum is 23. The CTE of amorphous silicon is 2.56. As a result of the large difference between the CTE of the deposited amorphous silicon material and the aluminum body, the stress on the deposited amorphous silicon material during a thermal cycle is increased so that the number of particles generated by the repeated thermal cycling of the process chamber is increased. The inventors have determined that aluminum oxide ($Al_2O_3$), having a CTE that is closer to the CTE of the deposited amorphous silicon material, will advantageously reduce stress on the deposited amorphous silicon material during a thermal cycle so that the number of particles generated by the repeated thermal cycling of the process chamber is decreased.

Figure 3:
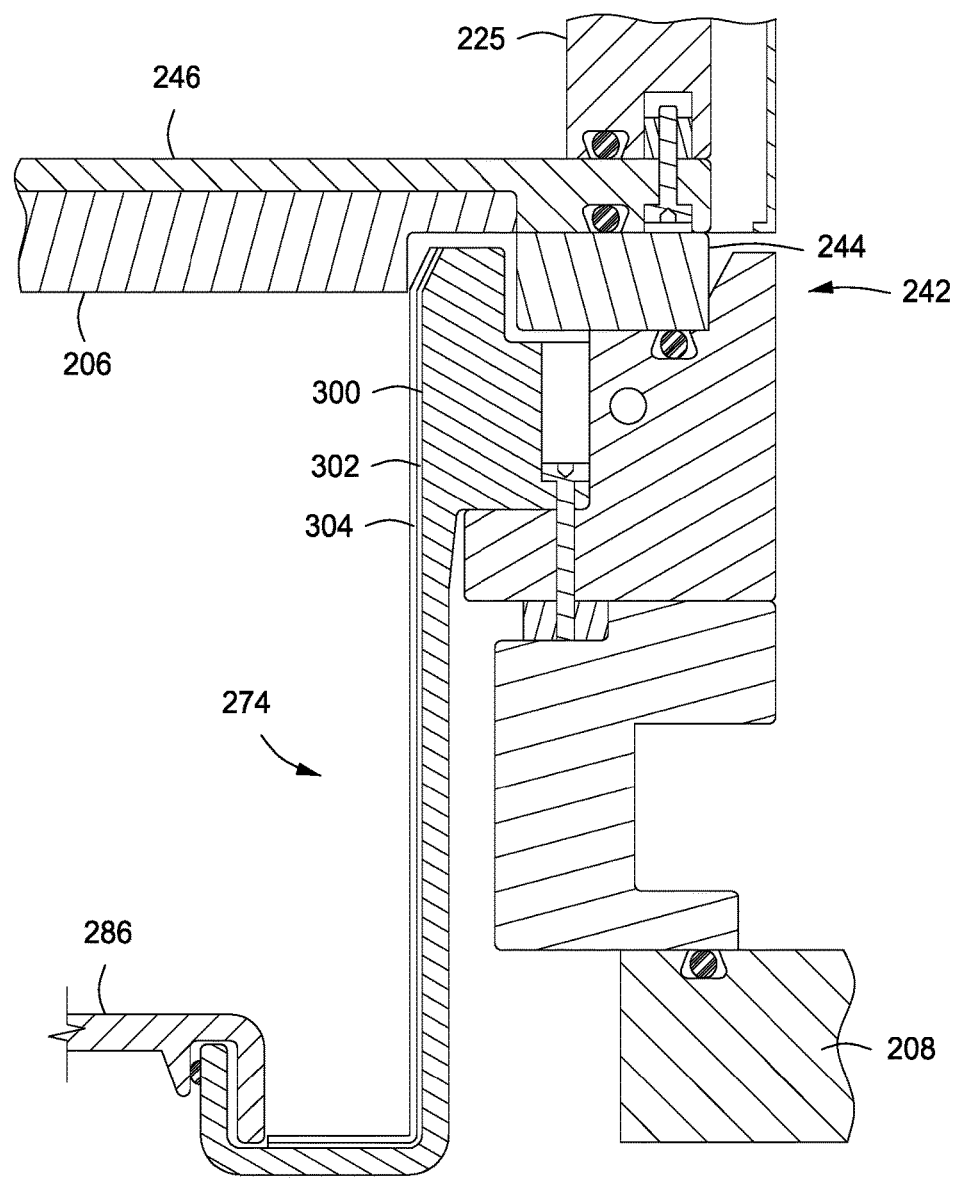
FIG. 3 is a schematic cross sectional view of part of the inner wall of the process chamber shown in FIG. 2 in accordance with some embodiments of the present disclosure.

A silicon nitride (SiN) layer having a first thickness is formed on the surface 280 of the process kit shield 274. FIG. 3 shows an enlarged schematic, cross-sectional view of part of the process chamber 200 of FIG. 2 having a silicon nitride layer 302 on the surface 280 of the process kit shield 274. The thickness of the silicon nitride layer 302 can vary depending on the number of substrates 204 to be processed. For example, prior to processing a run of 25 semiconductor wafers, a silicon nitride layer 302 having a first thickness of about 4000 to about 5000 angstroms, for example about 4500 angstroms, is formed directly onto the surface 280 of the process kit shield 274. The silicon nitride layer 302 is in direct contact (i.e. no other intervening layers or materials) with the surface 280 of the process kit shield 274. The inventors have observed that the silicon nitride layer 302 advantageously has improved adhesion to the body 279 of the process kit shield 274 and reduces of the number of particles generated from amorphous silicon material that is deposited on the body 279 of the process kit shield 274, in combination with the repeated thermal cycling of the process chamber 200.

Figure 4:
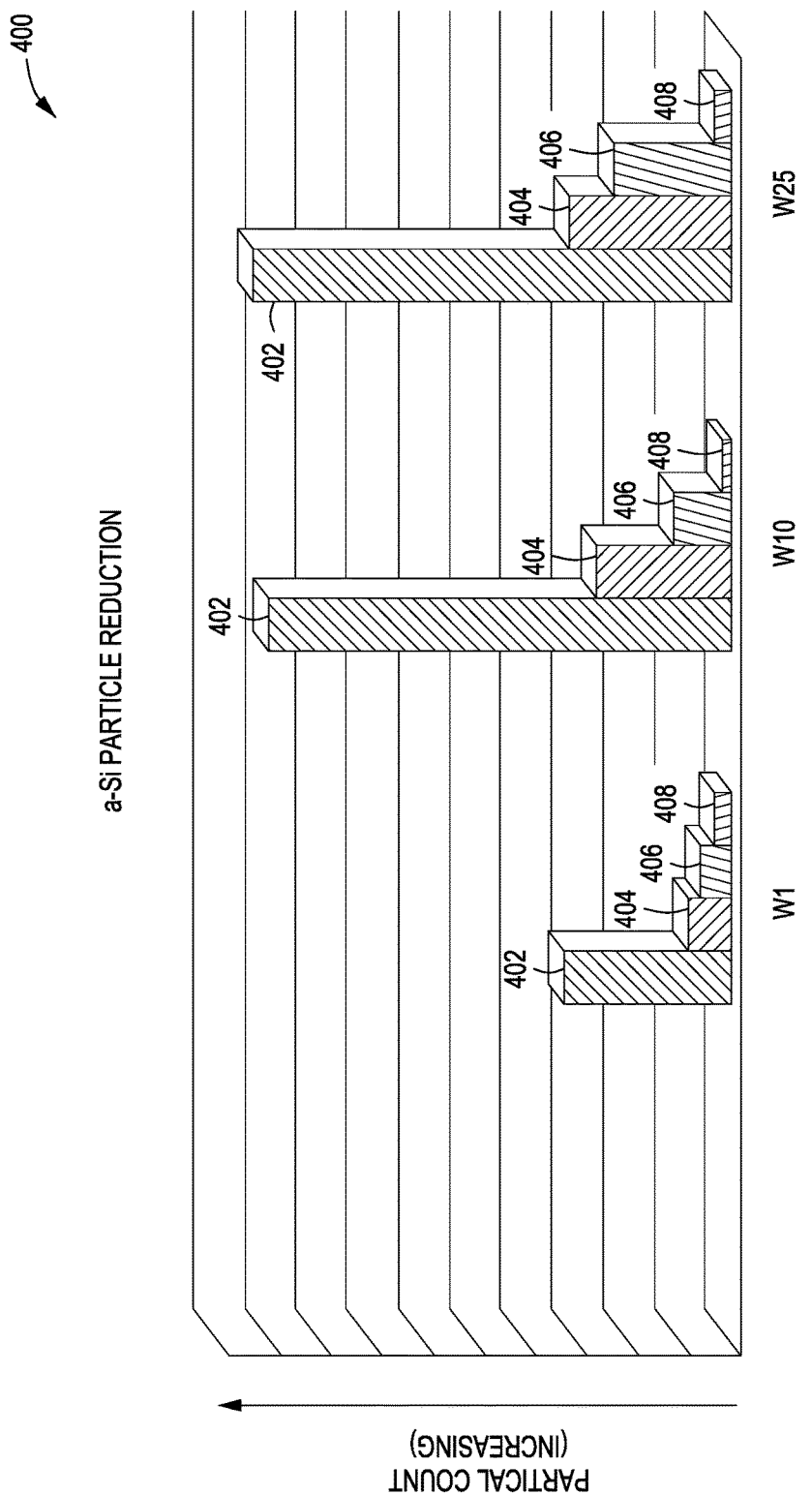
FIG. 4 depicts a graph showing amorphous silicon particle adder data for depositing an amorphous silicon material in accordance with some embodiments of the present disclosure.

FIG. 4 depicts a graph 400 showing amorphous silicon particle adder data for depositing an amorphous silicon material using a process kit shield 274 having (1) an aluminum (Al) body (bar 402), (2) an aluminum oxide ($Al_2O_3$) body (bar 404), (3) an aluminum body having a silicon nitride layer on the surface 280 (bar 406), and (4) an aluminum oxide ($Al_2O_3$) body having a silicon nitride layer on the surface 280 (bar 408). The graph 400 shows that amorphous silicon particle adders from an aluminum body (bar 402) are significantly higher as compared to amorphous silicon particle adders from an aluminum oxide ($Al_2O_3$) body (bar 404) after processing one semiconductor wafer (W1), ten semiconductor wafers (W10), and twenty-five semiconductor wafers (W25). The graph 400 shows that while an aluminum oxide ($Al_2O_3$) body (bar 404) and a silicon nitride layer on an aluminum body (bar 406) reduce amorphous silicon particle adders, the combination of the aluminum oxide ($Al_2O_3$) body having a silicon nitride layer on the surface 280 (bar 408) provides the greatest reduction in amorphous silicon particle adders.

FIG. 1 illustrates an example of a method 100 of processing a substrate. The disclosed method advantageously reduces the number of particles formed by a process of depositing an amorphous silicon layer on one or more substrates 204 (such as semiconductor wafers) in a physical vapor deposition (PVD) process chamber in accordance with embodiments of the present disclosure. In some embodiments, the process chamber shown in FIG. 2 may be used.

The method 100 begins at 102, by depositing a silicon nitride layer 302 atop a process kit shield 274. The process kit shield 274 comprises a body 279 composed of aluminum oxide ($Al_2O_3$) as described above. The silicon nitride layer 302 is deposited on a surface 280 of the body 279 facing the processing volume 248 of the process chamber 200 without any substrates 204 disposed in the process chamber 200.

The silicon nitride layer 302 is deposited by forming a plasma from a first process gas within the processing volume 248 of the process chamber 200 to sputter silicon from a surface of a target 206 within the processing volume 248 of the process chamber 200. The first process gas comprises a noble gas and a nitrogen ($N_2$) gas. In some embodiments, the first process gas consists of, or consists essentially of, a noble gas and a nitrogen ($N_2$) gas. In some embodiments, the noble gas is argon, helium, neon or xenon.

The noble gas is provided to the processing volume 248 of the process chamber 200 at a flow rate of about 50 sccm to about 200 sccm. The nitrogen ($N_2$) gas is provided to the processing volume 248 of the process chamber 200 at a flow rate of about 50 to about 1000 sccm. In some embodiments, the first process gas has a ratio of nitrogen ($N_2$) gas to noble gas of about 4:1.

The first process gas may be formed into a plasma by coupling sufficient energy, from a power source to ignite the process gas described above to form the plasma. The power source may be operable in a continuous wave (CW) or pulsed mode. The power source may include direct current (DC), pulsed DC, or radio frequency (RF) power. In some embodiments, the power source may provide pulsed DC power at a pulse frequency of about 100 to about 200 kHz and at a duty cycle (e.g., the percentage of on time during the total of on time and off time in a given cycle) of about 10% to about 40%.

General processing conditions for depositing the silicon nitride layer 302 includes maintaining process chamber pressure at about 3 millitorr to about 5 millitorr and maintaining substrate temperature at about 25 to about 400 degrees Celsius. In some embodiments, prior to depositing an amorphous silicon layer as described at 104 below, the first process gas may be purged from the process chamber.

Next, at 104, an amorphous silicon layer is deposited onto a predetermined number of one or more substrates 204 (for example, one or more semiconductor wafers). As used herein, amorphous silicon refers to a non-crystalline form of silicon. During deposition of the amorphous silicon layer onto the predetermined number of one or more substrates 204, amorphous silicon material is also deposited onto the silicon nitride layer 302 on the body 279 (e.g. amorphous silicon layer 304 as depicted in FIG. 3). The thickness of the amorphous silicon layer 304 that deposits onto the silicon nitride layer 302 on the body 279 can vary depending on the number of substrates 204 to be processed. For example, for a run of 25 semiconductor wafers, the amorphous silicon layer 304 may have a second thickness of about 12500 angstroms (i.e., about 500 angstroms per semiconductor wafer). In some embodiments, the ratio of the thickness of the silicon nitride layer 302 to the thickness of the amorphous silicon layer 304 is about 1:3. In some embodiments, the predetermined number of substrates 204 can be about 2000 to about 4500 before the particle adders within the process chamber reach unacceptable values and another coating of the silicon nitride layer 302, as described in 102, can be applied. As shown in FIG. 3, the amorphous silicon layer 304 is formed directly on top of the silicon nitride layer 302. As described above, the combination of body 279 composed of aluminum oxide ($Al_2O_3$) and a silicon nitride layer 302 advantageously greatly reduces the amorphous silicon particle adders within the process chamber 200.

The amorphous silicon layer that is deposited on the substrates 204 and consequently onto the silicon nitride layer 302 on the body 279 is deposited by forming a plasma from a second process gas within the processing volume 248 of the process chamber 200 to sputter silicon from a surface of a target 206 within the processing volume 248 of the process chamber 200. The second process gas comprises a noble gas and a hydrogen ($H_2$) gas. In some embodiments, the second process gas consists of, or consists essentially of, a noble gas and a hydrogen ($H_2$) gas. In some embodiments, the noble gas is argon, helium, neon or xenon. In some embodiments, the second process gas has a ratio of hydrogen ($H_2$) gas to noble gas of about 0:1 to about 1:1.

In some embodiments, the noble gas is provided to the processing volume 248 of the process chamber 200 at a flow rate of about 50 sccm to about 1000 sccm. In some embodiments, the hydrogen ($H_2$) gas is provided to the processing volume of the process chamber at a flow rate of about 2 to about 100 sccm.

The second process gas may be formed into a plasma by coupling sufficient energy from a power source to ignite the process gas described above to form the plasma. The power source may be operable in a continuous wave (CW) or pulsed mode. The power source may include direct current (DC), pulsed DC, or radio frequency (RF) power. In some embodiments, the power source may illustratively provide RF power at about 500 W to about 6 kW of power, at a suitable frequency, such as about 13.56 MHz to form the plasma. In some embodiments, the power source may provide pulsed DC power at a pulse frequency of about 100 to about 250 kHz and at a duty cycle (e.g., the percentage of on time during the total of on time and off time in a given cycle) of about 10% to about 40%.

General processing conditions for depositing the amorphous silicon layer 304 includes maintaining process chamber pressure at about 3 millitorr to about 10 millitorr and maintaining process chamber temperature at about 25 to about 400 degrees Celsius.

Next, at 106, 102-104 can be repeated for another predetermined number of one or more substrates 204. Accordingly, the body 279 will comprise repeating, alternating layers of the silicon nitride layer 302 and the amorphous silicon layer 304. In some embodiments, the body 279 will consist of, or consist essentially of, repeating, alternating layers of the silicon nitride layer 302 and the amorphous silicon layer 304. Once the total thickness of the repeating, alternating layers of the silicon nitride layer 302 and the amorphous silicon layer 304 reach a predetermined third thickness, the process kit shield 274 can be removed from the process chamber and replaced with a new process kit shield 274 or cleaned. The third thickness can vary depending on the number of substrates 204 processed in the process chamber 200.

Returning to FIG. 2, the substrate support 202 may be located within a grounded enclosure wall 208, which may be a chamber wall (as shown) or a grounded shield. (A grounded shield 240 is shown covering at least some portions of the process chamber 200 above the target 206. In some embodiments, the grounded shield 240 may extend below the target to enclose also the substrate support 202).

The target 206 may be supported on a grounded, conductive sidewall of the chamber, referred to in some embodiments as an adapter 242, through a dielectric isolator 244. In some embodiments, the grounded, conductive sidewall of the chamber, or adapter 242, may be fabricated from aluminum. The target 206 comprises a material, such as silicon, which is to be deposited on the substrate 204 during sputtering, such as to form amorphous silicon.

In some embodiments, a backing plate 246 may be coupled to a back surface 232 of the target 206 (i.e., the surface opposite the target surface facing the substrate support 202. The backing plate 246 may comprise a conductive material, such as copper-zinc, copper-chrome or the same material as the target, such that RF and/or DC energy can be coupled to the target 206 via the backing plate 246. Alternatively, the backing plate 246 may be a non-conductive material which may include conductive elements, such as electrical feedthroughs or the like, for coupling the target 206 to a conductive member 225 to facilitate providing at least one of RF or DC power to the target 206. The backing plate 246 may also or alternatively be included, for example, to improve structural stability of the target 206.

A rotatable magnetron assembly 236 may be positioned proximate to the back surface 232 of the target 206. The rotatable magnetron assembly 236 includes a plurality of magnets 266 supported by a base plate 268. The magnets 266 produce an electromagnetic field around the top of the process chamber 200 and are turned to rotate the electromagnetic field which varies the plasma density of the process in a manner that more uniformly sputters the target 206.

The substrate support 202 includes a material-receiving surface that faces the principal surface of the target 206 and which supports the substrate 204 to be sputter coated in planar position opposite to the principal surface of the target 206. The substrate support 202 may support the substrate 204 in a processing volume 248 of the process chamber 200. The processing volume 248 may be defined as the region located above the substrate support 202 during processing (for example, between the target 206 and the substrate support 202 when in a processing position).

The process kit shield 274 may be coupled to the process chamber 200 in any suitable manner that retains the process kit shield 274 in a given position within the process chamber 200. For example, in some embodiments, the process kit shield 274 may be connected to a ledge 276 of the adapter 242. The adapter 242, in turn, is sealed and grounded to the enclosure wall 208. Generally, the process kit shield 274 extends downwardly along the walls of the adapter 242 and the enclosure wall 208 to below a top surface of the substrate support 202 and then upwardly until reaching a top surface of the substrate support 202 (e.g., forming a U-shaped portion 284 at the bottom). Alternatively, instead of a U-shaped portion 284, the bottommost portion of the process kit shield may have another suitable configuration. A cover ring 286 may rest atop an upwardly extending lip 288 of the process kit shield 274 when the substrate support 202 is in a lower, loading position. The cover ring 286 may rest on the outer periphery of the substrate support 202 when the substrate support 202 is in an upper, deposition position to protect the substrate support 202 from sputter deposition. One or more additional deposition rings (one deposition ring 203 shown in FIG. 2) may be used to shield the periphery of the substrate support 202 from deposition.

While the foregoing is directed to embodiments of the present disclosure, other and further embodiments of the disclosure may be devised without departing from the basic scope thereof.

The invention claimed is:

1. A process kit shield for depositing an amorphous silicon material, comprising:
 a body having a surface facing a processing volume of a physical vapor deposition (PVD) process chamber, wherein the body is composed of aluminum oxide ($Al_2O_3$); and
 a silicon nitride layer on the surface of the body.

2. The process kit shield of claim 1, further comprising an amorphous silicon layer on the silicon nitride layer.

3. The process kit shield of claim 2, wherein a ratio of a first thickness of the silicon nitride layer to a second thickness of the amorphous silicon layer is about 1:3.

4. The process kit shield of claim 2, wherein the body comprises a third layer of repeating, alternating layers of the silicon nitride layer and the amorphous silicon layer having a predetermined third thickness.

5. A physical vapor deposition (PVD) process chamber for depositing an amorphous silicon material, comprising:
 a process kit shield comprising a body having a surface facing a processing volume of the physical vapor deposition (PVD) process chamber, wherein the body is composed of aluminum oxide ($Al_2O_3$);
 a silicon nitride layer having a first thickness on the surface of the body; and
 an amorphous silicon layer having a second thickness on the silicon nitride layer;
 a substrate support pedestal disposed in the process chamber beneath the processing volume; and
 a target disposed opposite the substrate support pedestal.

6. The physical vapor deposition (PVD) process chamber of claim 5, wherein a ratio of the first thickness of the silicon nitride layer to the second thickness of the amorphous silicon layer is about 1:3.

7. The physical vapor deposition (PVD) process chamber of claim 5, wherein the body comprises a third layer of repeating, alternating layers of the silicon nitride layer and the amorphous silicon layer having a predetermined third thickness.

8. A method of processing a substrate in a physical vapor deposition (PVD) process chamber, comprising:
 (a) depositing a silicon nitride layer atop a surface of a process kit shield facing a processing volume of the PVD process chamber, wherein the process kit shield comprises a body composed of aluminum oxide ($Al_2O_3$), and wherein the silicon nitride layer is deposited without a substrate disposed in the PVD process chamber; and
 (b) subsequently depositing an amorphous silicon layer onto a predetermined number of substrates in the PVD process chamber, wherein amorphous silicon material also forms an amorphous silicon layer on the silicon nitride layer.

9. The method of claim 8, further comprising:
 (c) repeating (a)-(b) to form repeating, alternating layers of the silicon nitride layer and the amorphous silicon layer having a third thickness.

10. The method of claim 8, wherein depositing the silicon nitride layer further comprises:
 forming a plasma from a first process gas within a processing volume of the physical vapor deposition (PVD) process chamber, wherein the first process gas comprises a noble gas and a nitrogen ($N_2$) gas to sputter silicon from a surface of a target within the processing volume of the physical vapor deposition (PVD) process chamber.

11. The method of claim 10, wherein the noble gas is provided at a flow rate of about 50 to about 200 sccm.

12. The method of claim 10, wherein the nitrogen ($N_2$) gas is provided at a flow rate of about 50 to about 1000 sccm.

13. The method of claim 10, wherein the first process gas has a ratio of nitrogen ($N_2$) gas to noble gas of about 4:1.

14. The method of claim 8, wherein depositing the amorphous silicon layer further comprises:
 forming a plasma from a second process gas within a processing volume of the physical vapor deposition (PVD) process chamber, wherein the second process gas comprises a noble gas and a hydrogen ($H_2$) gas to sputter silicon from a surface of a target within the processing volume of the physical vapor deposition (PVD) process chamber.

15. The method of claim 14, wherein the noble gas is provided at a flow rate of about 50 to about 1000 sccm.

16. The method of claim 14, wherein the hydrogen ($H_2$) gas is provided at a flow rate of about 2 to about 100 sccm.

17. The method of claim 14, wherein the second process gas has a ratio of hydrogen ($H_2$) gas to noble gas of about 0:1 to about 1:1.

18. The method of claim 8, wherein a pressure in the processing volume of the physical vapor deposition (PVD) process chamber during deposition of the silicon nitride layer is about 3 to about 5 millitorr.

19. The method of claim 8, wherein a temperature in the processing volume of the physical vapor deposition (PVD) process chamber during deposition of the silicon nitride layer is about 25 to about 400 degrees Celsius.

20. The method of claim 8, wherein a ratio of a first thickness of the silicon nitride layer to a second thickness of the amorphous silicon layer is about 1:3.

* * * * *